United States Patent [19]

Morris et al.

[11] Patent Number: 5,756,225
[45] Date of Patent: May 26, 1998

[54] SINGLE CRYSTAL OXIDE TURBINE BLADES

[75] Inventors: Robert C. Morris; Devlin M. Gualtieri, both of Ledgewood; Dave Narasimhan, Flemington; Philip J. Whalen, Sparta, all of N.J.

[73] Assignee: AlliedSignal Inc., Morris Township, N.J.

[21] Appl. No.: 143,033

[22] Filed: Oct. 29, 1993

Related U.S. Application Data

[63] Continuation-in-part of Ser. No. 867,566, Apr. 13, 1992, Pat. No. 5,573,862.
[51] Int. Cl.$^6$ ................................ B32B 15/00; B32B 31/00
[52] U.S. Cl. ........................... 428/700; 428/701; 428/702; 415/200; 427/427; 29/889.71
[58] Field of Search ........................................ 428/688, 689, 428/699, 700, 701, 702, 408; 416/183; 415/200; 427/427; 29/889.71

[56] References Cited

U.S. PATENT DOCUMENTS

| | | | |
|---|---|---|---|
| 4,135,857 | 1/1979 | Pannmone | 416/219 R |
| 4,520,501 | 5/1985 | Miki | 416/183 |
| 5,180,285 | 1/1993 | Lav | 416/241 B |
| 5,395,694 | 3/1995 | Sogabe et al. | 428/404 |
| 5,451,142 | 9/1995 | Cetel et al. | 416/241 R |

*Primary Examiner*—Peter A. Nelson
*Attorney, Agent, or Firm*—Verne E. Kreger, Jr.

[57] ABSTRACT

Blades for use in combusion turbine engines are formed from a single crystal aluminum garnet body—desirably a rare earth aluminum garnet body—having an epitaxial surface layer of a second aluminum garnet having a lattice constant larger than that of the body garnet so as to provide a compressive strain, to thereby strengthen the blade.

27 Claims, 3 Drawing Sheets

FIG. 4

SINGLE CRYSTAL OXIDE TURBINE BLADES

CROSS-REFERENCE TO RELATED APPLICATION

This application is a continuation-in part of commonly assigned U.S. application Ser. No. 867,566 filed 13, Apr. 1992, and now U.S. Pat. No. 5,573,862.

FIELD OF THE INVENTION

This invention relates to turbine engines and provides new blades for use in the turbine section of such engines. The turbine blades are made of single crystal aluminum garnets which are surface strengthened. They permit engine operation at temperatures above those possible with conventional metal blades.

BACKGROUND OF THE INVENTION

The performance of turbine engines for both power generation and aircraft propulsion has made dramatic advances in recent decades due to advances in materials technology. In turbine engines for aircraft, a high output to weight ratio is desired. Engine efficiency increases with increasing temperatures in the combustion section. The temperature limiting factor in this application is the availability of materials of construction for turbine blades. Turbine blades are commonly made of nickel-based superalloys. Advances in casting techniques—such as investment casting, which permitted production of blades with complex internal passages for air cooling; casting of nickel superalloys with directional solidification in the investment casting process which ultimately led to single crystal superalloy blades; and finally the development of surface coatings to protect against oxidation and corrosion—have dramatically increased the temperature performance of such blades. However, metals technology is approaching the upper temperature limit, and new materials of construction are needed to provide further advances. Oxide crystals offer themselves as material of construction for turbine blades because of high theoretical strength and oxidation resistance. However, lack of mechanical durability and strength in actual application has heretofore prevented their use in this demanding application. We have investigated oxide crystals for potential use in this application and have found that those of one particular class, namely rare earth aluminum garnets, have the necessary strength and creep resistance, provided they can be protected against failure by brittle fracture. We have found that such protection can be provided for service at surprisingly high temperatures by careful surface polishing followed by deposition of an epitaxial (single crystal) garnet layer which puts the surface of the blade under significant compression.

Compressive surface layers are employed widely to improve the low temperature strength and impact resistance of brittle solids and objects. A common example is "tempered" glass for automotive and architectural applications. Surface compression in glass and metallic materials has been achieved by a variety of methods including heat treatment, shot peening and ion exchange. The surface stresses produced by these methods, however, generally relax upon exposure of the solid to temperatures in the neighborhood of 0.5 or less times the absolute melting point.

Compressive epitaxially deposited layers have previously been provided on single crystal laser media, including on single crystal yttrium aluminum garnet laser rods for improvement of low temperature strength and durability (U.S. Statutory Invention Registration H557 by Morris et al. for "Epitaxial Strengthening of Crystals"; Marion et al., *Compressive epitactic layers on single-crystal components for improved mechanical durability and strength*, J. Appl. Phys. 62, 2065–2069 (1987)).

SUMMARY OF THE INVENTION

The present invention provides blades for use in turbine engines comprising a single crystal aluminum garnet body, on which body there is deposited an epitaxial aluminum garnet layer having a lattice constant larger than that of the single crystal garnet body sufficient to provide a compressive strain of from about 0.02 to about 0.40 percent, wherein the surface of the single crystal aluminum garnet body has been subjected to a polishing treatment before deposition of the epitaxial aluminum garnet layer.

The single crystal aluminum garnet is desirably a rare earth aluminum garnet, and more desirably still an yttrium aluminum garnet (YAG).

This invention further provides a method for forming a blade for use in turbine engines which comprises forming a turbine blade body from a single crystal aluminum garnet; polishing the formed garnet blade body to remove surface imperfections; followed by depositing on the polished surface an epitaxial aluminum garnet layer having lattice dimensions greater than those of the underlying blade body so that the lattice mismatch provides a compressive strain of from about 0.02 to about 0.40 percent.

The term "turbine blade" as used herein includes the airfoil section, singly or in combination with the root section and platform of individually demountable units, as well as the disk section of integral airfoil-disk components, or any combination thereof, or any integral combination of the airfoil with appropriate mounting means.

The term "aluminum garnet" as used herein includes garnets wherein part of the aluminum has been replaced by scandium.

BRIEF DESCRIPTION OF THE DRAWINGS

In the annexed drawings.

DETAILED DESCRIPTION OF THE INVENTION

Garnets are oxide-containing crystals of complex structure which crystallize in the cubic system. Naturally occurring silicate garnets have high hardness; they have been used as abrasives. Synthetic garnets have been much studied recently since they include magnetic materials of importance to microwave applications and for information storage. Neodymium-substituted yttrium aluminum garnets have found wide use as laser hosts. For detailed information on garnets, their composition and lattice structure, reference is made to Landolt-Bornstein, *Numerical Data and Functional Relationships in Science and Technology, New Series Group III; Crystal and Solid State Physics, Vol.* 12, *Magnetic and Other Properties of Oxides and Related Compounds, Part (a), Garnets and Perovskites*, K. H. Hellwege, Ed.-in-Chief, Springer Verlag; Berlin, Heidelberg, N.Y., 1978.

We have found that rare earth substituted aluminum garnets have the high strength and oxidation and creep resistance at high temperatures which is required for materials for making turbine blades for the aforementioned application. Suitable rare earth aluminum garnet compositions for construction of these blade bodies include yttrium aluminum garnet (YAG, $Y_3Al_5O_{12}$), holmium aluminum garnet (HoAG, $Ho_3Al_5O_{12}$), as well as:

| | |
|---|---|
| $Lu_3Al_5O_{12}$ | $Y_3Al_3Sc_2O_{12}$ |
| $Yb_3Al_5O_{12}$ | $Dy_3Al_3Sc_2O_{12}$ |
| $Tm_3Al_5O_{12}$ | $Tb_3Al_3Sc_2O_{12}$ |
| $Er_3Al_5O_{12}$ | $Gd_3Al_3Sc_2O_{12}$ |
| $Dy_3Al_5O_{12}$ | $Eu_3Al_3Sc_2O_{12}$ |
| $Tb_3Al_5O_{12}$ | $Gd_3Al_5O_{12}$ |

In any event, the composition of the garnet material of which the blade body is made is preferably congruently melting, which simplifies the growth of large single crystals. Of the above-mentioned rare earth substituted aluminum garnets, yttrium aluminum garnet is preferred for reasons of cost, availability, high temperature strength and high temperature oxidative stability, high modulus and low density. The physical characteristics of yttrium aluminum garnet are set forth in Table I, below:

TABLE I

| Density | 4.53 g/cm$^3$ |
|---|---|
| Melting Point | 1950° C. |
| Debye Temperature | 750 K |
| Thermal Conductivity (at 25° C.) | 9.13 W/cm/K |
| Refractive Index (at 550 nm) | 1.84 |
| Hardness (at 25° C.) | $1.7 \times 10^3$ kg/mm$^2$ |
| Hardness (at 1400° C.) | $0.49 \times 10^3$ kg/mm$^2$ |
| Coeff. of Thermal Exp. (at 25° C.) | 7.5 ppm/°C |
| $c_{11}$ | $33.35 \times 10^{11}$ dyne/cm$^2$ |
| $c_{12}$ | $11.1 \times 10^{11}$ dyne/cm$^2$ |
| $c_{44}$ | $11.5 \times 10^{11}$ dyne/cm$^2$ |
| Bulk Modulus | $18.8 \times 10^{11}$ dyne/cm$^2$ |
| Young's Modulus | $28.7 \times 10^{11}$ dyne/cm$^2$ |
| Shear Modulus | $11.5 \times 10^{11}$ dyne/cm$^2$ |
| Poisson's Ratio | 0.248 |
| Anisotropy Ratio [$(2c_{44})/(c_{11}-c_{12})$] | 1.034 |

Single crystal rare earth-substituted aluminum garnets, including yttrium aluminum garnet, can be grown from the melt of the constituent oxides using known methods, such as the Czochralski technique or the Bridgman technique. In the former, the constituent raw material oxides—$Al_2O_3$ and $Y_2O_3$ in the case of yttrium aluminum garnet—are melted in a crucible made of refractory metal (e.g. tungsten, tantalum, molybdenum or iridium), usually by induction heating. A seed crystal attached to a rotating rod is brought into contact from above with the melt surface and is slowly withdrawn so that the melt crystallizes onto the seed material, thereby creating a single crystal boule. In the Bridgman technique, a melt is provided in a suitable container which is passed through a temperature gradient to effect nucleation and crystallization along the gradient. A further method, known as the Tyco method, (See U.S. Pat. No. 3,591,348) permits melt growth of blade shape cross-section single crystals by slowly withdrawing a crystal from the meniscus formed at a die having the cross-sectional shape of the desired blade. The Tyco method is also known as the "Edge-defined Film-fed Growth" (EFG) method. In any event, methods for growing single crystal bodies of aluminum garnet, including yttrium aluminum garnet, are well known.

Once a single crystal ingot of the aluminum garnet has been obtained, it is fabricated into the desired blade shape. The blade body can be machined from a single crystal boule (as for example obtained by the Czochralski method) using known procedures, including diamond machining (grinding) or laser chipping. Diamond grinding is a well known technique used for machining useful shapes of hard materials such as single crystal oxides, or for shaping preforms of single crystal materials. In laser chipping, small flakes of the crystal material are chipped off the surface by subjecting the surface to pulses of a $CO_2$ laser, for example, to a depth of a few μm, say in the order of 2 to 5 μm. Localized heating results in spalling with consequent removal of surface material.

By the Bridgman technique, a near net shape preform can be obtained using a suitable mold in combination with directed solidification, as for example by melting the constituent oxides in a metal mold and then directionally solidifying it into the form of the desired blade. In the EFG method (the Tyco method) the initial product can be a blade-shaped extended body which is brought to final dimension by means of laser chipping or diamond machining (grinding).

Once the blade body has been machined to the final desired shape utilizing any of the above-described methods (or any other suitable method), it must be subjected to a polishing treatment to remove the surface cracks which inevitably result from the preceding machining operations. Without the polishing treatment, the blade body would lack strength, since the minute surface cracks and other imperfections provide the starting place for catastrophic cracks. The polishing treatment is thus an essential, critical step. Suitable methods for polishing the formed blade body include mechanical polishing, chemo-mechanical polishing, and chemical polishing. Of course, if desired, flame polishing may also be resorted to. This requires heating of the blade surface to temperature just above the melting point of the crystal.

Mechanical polishing involves material removal with a series of successively finer abrasive grits, such that at each step the damage left from the preceding step is removed. This process would culminate with submicron diamond or other abrasive grits. The abrasive grit may be utilized in suspension in a suitable liquid, such as ethylene glycol, to form a polishing paste. Polishing may be done in the usual manner, utilizing a cloth pad. Polishing can also be accomplished by impinging abrasive particles entrained in a liquid jet on the workpiece.

Chemo-mechanical polishing involves combined chemical and abrasive action as would, for example, be obtained by polishing with a suspension of fine diamond grit or colloidal silica in aqueous alkali, for example sodium hydroxide. Suitable polishing agents of this type are commercially available. Chemo-mechanical polishing can be performed with a polishing pad, or by liquid jet impingement.

Chemical polishing is a preferred polishing method for present purposes. It involves subjecting the body of the formed blade to treatment with hot phosphoric acid or other chemical polishing agents to remove a surface layer from the blade body by dissolution. It should be noted that, for present purposes, a polishing treatment—as distinguished from an etch treatment—is required. Suitable treatment methods have, for example, been described by D. C. Miller in *Chemical Polishing of Garnets with Phosphoric Acid*, J. Elect. Materials 1, No. 4, 499–547 (1972); Szaplonczay et al. *Chemical etching of gadolinium-gallium garnet substrates*, J. Mat. Science 7, 1280–1284 (1972).

In an exemplary polishing treatment, fabricated aluminum garnet blades are first subjected to a preparatory etch for surface preparation to remove any contamination. This may be done by submerging the blade body in a bath of about 85% orthophosphoric acid, heated to about 160° C., and contained in a platinum crucible. Suitably, the blade body is held in a platinum holder and is rotated within the hot acid for a period of about 3 min. It is then removed from the acid bath, spun dry to remove surface acid, and is then thoroughly rinsed in deionized water. Thereafter, the acid polishing treatment is conducted by submerging the body in a bath of about 85% orthophosphoric acid maintained at a temperature greater than 300° C., say at about 400° C. Suitably, the blade body is first held a short distance above the surface of the bath to allow temperature equilibration, and is then immersed in the acid for a period of time, generally within the range of from about 5 minutes to about 4 hours, until the desired thickness of surface layer has been removed, while rotating the body within the acid bath. Thereafter, the body is removed from the bath, spun dried, rinsed with deionized water, and dried in a high purity nitrogen gas stream. Acid polishing in about 85% orthophosphoric acid at temperatures in the order of 300°–400° C. removes about 1.5 to 5 μm surface layer per minute. It is also possible to utilize a phosphoric acid/sulfuric acid mixture for the surface polishing operation.

As a general proposition, the surface of the blade body should be removed to a depth corresponding to at least about twice the size of the grit that was used in the prior forming operation, desirably about 2.5 to 5 times the size of the grit. The purpose of the polishing operation is the removal of surface cracks. These may be invisible cracks, less than a wavelength of light wide, yet they could present the starting point for catastrophic failure by brittle fracture. The polishing operation thus maximizes the strength of the single crystal aluminum garnet blade body.

Since the critical purpose of the polishing operation is not per se to obtain a smooth surface, but instead to remove the minute, microscopic and sub-microscopic surface cracks, it is not possible to define the required degree of polishing by specifying a maximum tolerable surface roughness. The above-stated relationship between the thickness of the surface layer that is being removed in the polishing treatment and the size of the grit that was used for the fabrication is one suitable rough measure for the effectiveness of the polishing treatment. Another more direct method to determine the depth to which the body must be polished in order to maximize strength would be to provide test bars of the material of the same composition, treat (machine) them in the same manner as the blade body, and then polish the test bars to varying depths and determine the depth required for maximum strength. Strength of the test bars can be determined by any method commonly employed for testing strength of ceramics and crystals, as for example by the biaxial flexure test, ASTM Standard F394. The effect of surface treatment (polishing) on the strength of singly crystal YAG elements is illustrated by the experiment of Example 1, below.

EXAMPLE 1

Figure 1:
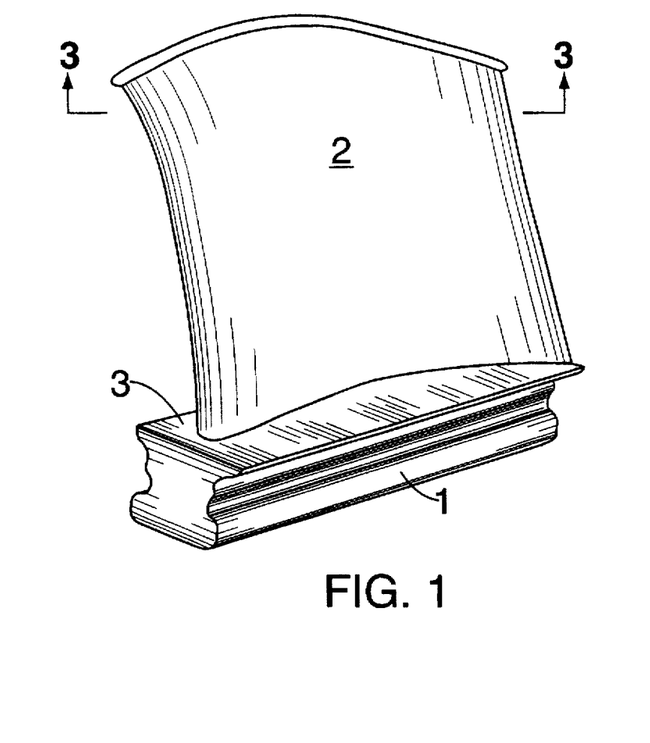
FIG. 1 illustrates a demountable turbine blade of the present invention, composed of a base 1 adapted for insertion into a mating slot on a turbine disk, airfoil 2, and platform 3 providing the connection between base 1 and airfoil 2.
Figure 2:
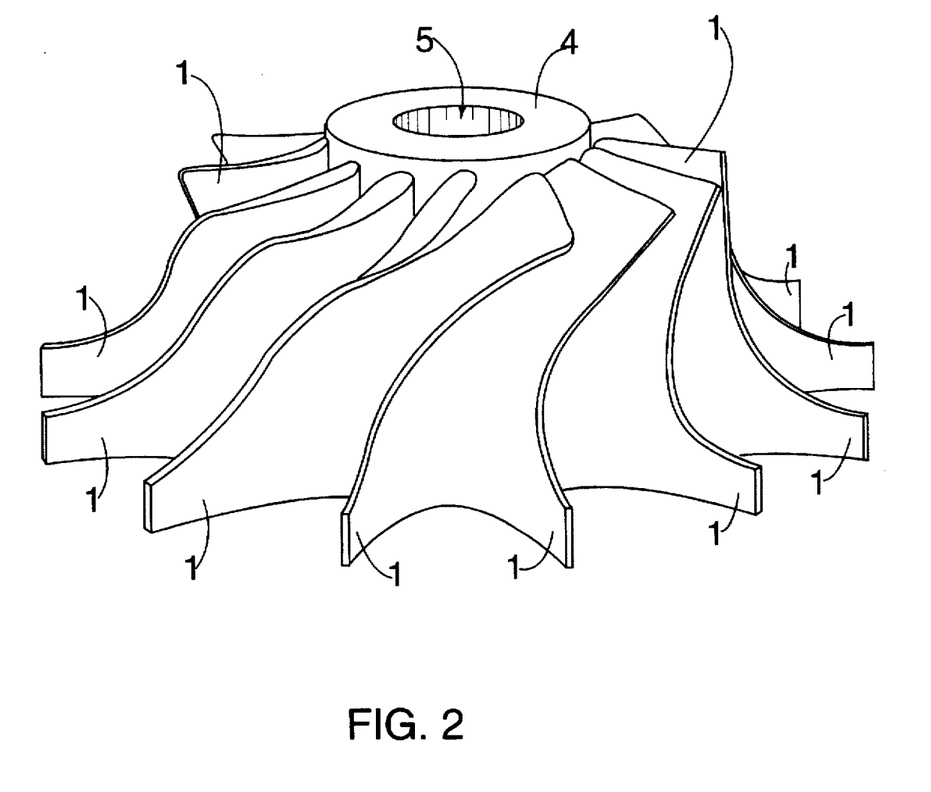
FIG. 2 illustrates another embodiment of the turbine blade of the present invention wherein the airfoils and turbine disk are formed as an integral unit. Turbine blades 1 and disk 4 are formed as an integral unit. Disk 4 may be provided with aperture 5 for mounting on the rotatable engine shaft.
Figure 3:
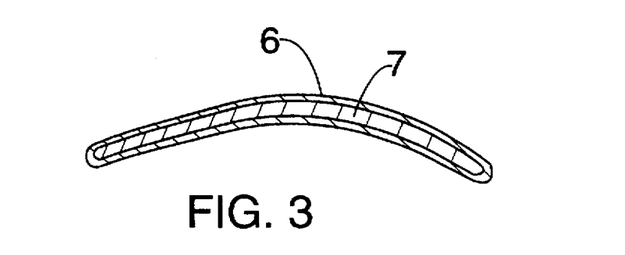
FIG. 3 schematically depicts a cross-section along A—A of blade 1 of FIG. 1, having a single crystal blade body 6 provided with an epitaxially deposited garnet layer 7.
Figure 4:
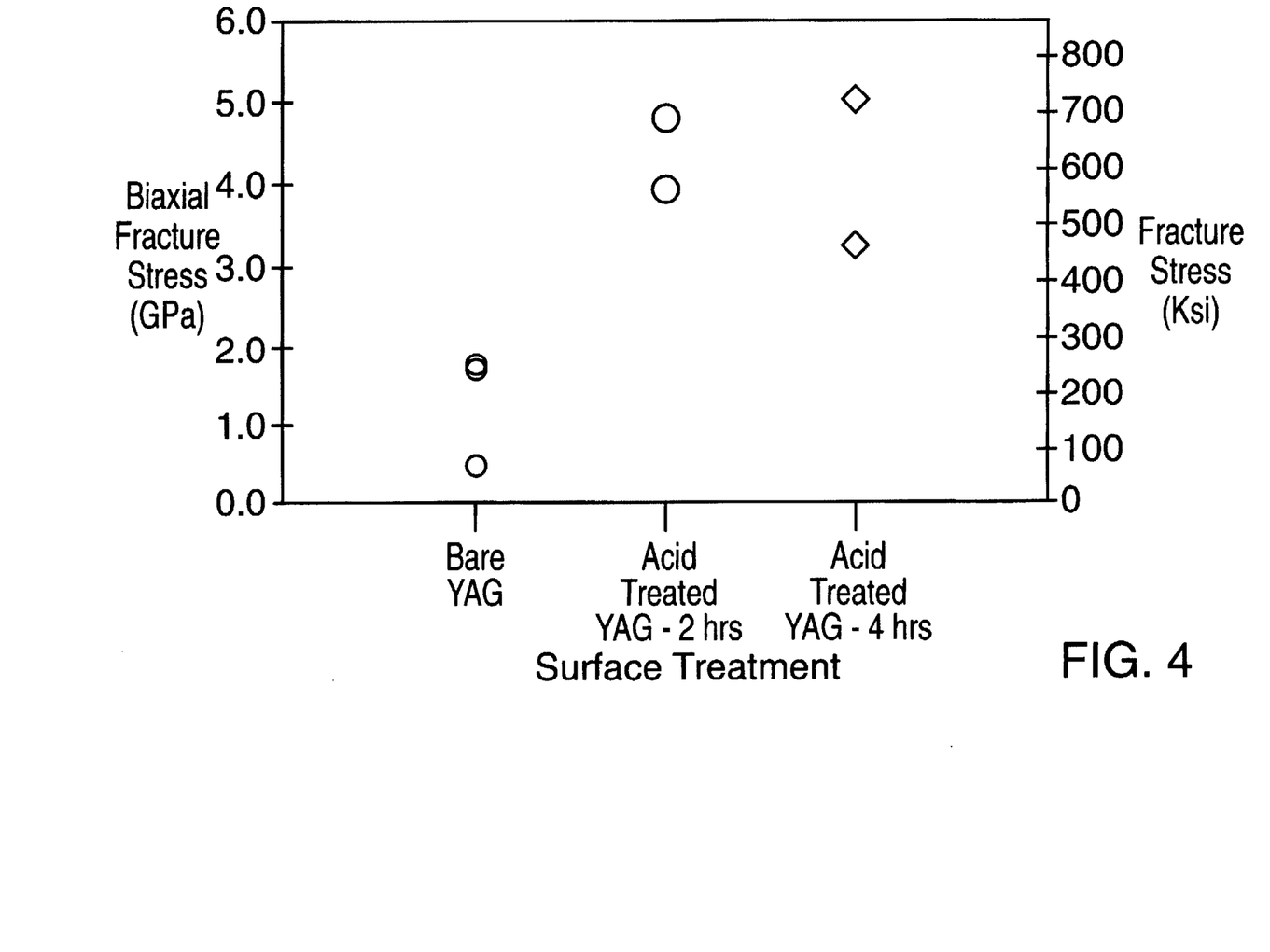
FIG. 4 is a graphic presentation of comparative data obtained on measurement of the biaxial bending strength of single crystal yttrium aluminum garnet wafers, before and after chemical polish.

A series of 2.54 cm diameter by 0.635 mm thick YAG disks were given different surface treatments and then subjected to biaxial fracture testing per ASTM Standard F394. In this test, a disk-shaped specimen is supported from below by three balls and loaded from above by a single centrally located ball. Tensile fracture initiates on the bottom surface. Three control samples were subjected to chemomechanical polishing. The measured strength of the control samples ranged from 0.3 to 1.6 GPa. Four identical chemomechanically polished disks were then treated with hot phosphoric acid, as above described. Two samples were treated for a period of 2 hours each; 0.03 mm of surface layer was removed during this time period. The other two samples were treated for a period of 4 hours each; 0.06 mm of surface layer was removed during this time period on these samples. The acid treatment (chemical polish) produced a smooth, featureless surface, free from etch pits. The measured biaxial fracture strength (per ASTM Standard F394) of the chemically polished samples ranged from 3.18 to 4.97 GPa. The significant improvement in strength is the result of the removal of microscopic surface damage by the chemical polish treatment. The test results are graphically presented in FIG. 4.

Once the maximum strength of the blade body has been achieved by means of the above-described polishing treatment, that strength is preserved by providing an epitaxial garnet compressive and protective layer. This layer serves three purposes: first, it protects the surface of the body against environmental attack; second, it preserves the pristine surface of the body that was achieved through the polishing treatment; third, it places the blade surface under compression, providing resistance to subsequent microscopic damage.

As a general proposition, the epitaxial layer must be a single crystal garnet layer having good resistance to attack in the environment to which it will be subjected, and it must have a lattice constant slightly larger than, but still compatible with, that of the body. These requirements impose restrictions on the composition of the layer, but these seem to be the only source for compositional restrictions. Suitably, the epitaxial garnet layer is a rare earth-substituted aluminum garnet. The lattice mismatch may be provided, for example, by choice of different garnets out of the class of aluminum garnets, or it may be provided by using the same garnet material as that used for the body, but alloying it with elements having larger atomic volume than those present in the body garnet in order to increase the lattice constant. For example, gadolinium-alloyed yttrium aluminum garnet and dysprosium aluminum garnet have larger lattice constants than yttrium aluminum garnet, and thus provide suitable material for the epitaxial layer on the latter.

The strain in the epitaxial overlayer can be determined by calculation from the known lattice constants of the body garnet and the epitaxial layer garnet. The lattice constants are determined using conventional X-ray procedures, as for example described in Bond in *Precision Lattice Constant Determination*, Acta Cryst. 13, 814–818 (1960); Bond, *Precision lattice constant determination: erratum*, Acta Cryst. A31, 698 (1975); Barns, *A Survey of Precision Lattice Parameter Measurements as a Tool for the Characterization of Single-Crystal Materials*, Mater. Res. Bull. 2, 273–282 (1967). From the known lattice constants, the stress in the epitaxial garnet layer can be calculated by methods described by Blank et al. in *The Growth of Magnetic Garnets by Liquid Phase Epitaxy*, J. Cryst. Growth 17, 302–311

(1972); and Besser et al., *A Stress Model for Heteroepitaxial Magnetic Oxide Films Grown by Chemical Vapor Deposition*, Mater. Res. Bull. 6, 1111–1124 (1971).

In general, maximum possible compressive strain compatible with a smooth epitaxial layer is desired for the compressive layer. For the aluminum garnets produced by the liquid phase epitaxy crystal growth technique, this maximum strain corresponds to about 0.40% difference in lattice constant between layer and body, the lattice constant of the layer being larger than that of the body for compressive, as distinguished from tensile, strain. The maximum thickness for defect-free epitaxy is a function of the compressive strain. Dysprosium aluminum garnet, a composition with about 0.33% compressive strain with respect to yttrium aluminum garnet, can be prepared as defect-free epitaxial layers only to a thickness up to about 5 μm. Holmium aluminum garnet, a composition with about 0.04% compressive strain with respect to yttrium aluminum garnet, can be prepared as defect-free epitaxial layers to a thickness of nearly 100 μm. For example, for layer compositions of the general formula $$(Y_{1-a-b}, R^1_a, R^2_b)_3 Al_3(Al_{1-c}, Sc_c)_2 O_{12}$$

the strain can be expressed as

Strain (%)=(a) $(k_1)$+(b) $(k_2)$+(c) (2.25)

where $k_1$ and $k_2$ are selected from Table II, below. Exemplary compositions compatible with a condition of 0.15% strain in this equation are shown below. Of course, layers of greater and lesser compression within the scope of this invention are workable also.

TABLE II

| $R^1$, $R^2$ | $k_1$, $k_2$ |
|---|---|
| Lu | −0.73 |
| Yb | −0.59 |
| Tm | −0.36 |
| Er | −0.16 |
| Y | 0.0 |
| Ho | 0.01 |
| Dy | 0.35 |
| Tb | 0.62 |
| Gd | 0.94 |
| Eu | 1.02 |
| Sm | 1.40 |
| Nd | 1.95 |
| Pr | 2.33 |
| La | 3.07 |

Exemplary pairs of suitable body aluminum garnets and corresponding aluminum garnet compositions for the epitaxial layer are set forth in Table III, below:

TABLE III

| Body | Compressive Layer | Est. Comp. Strain (%) |
|---|---|---|
| $Lu_3Al_5O_{12}$ | $Y_{0.61}Lu_{2.39}Al_5O_{12}$ | 0.15 |
| $Yb_3Al_5O_{12}$ | $Y_{0.76}Yb_{2.24}Al_5O_{12}$ | 0.15 |
| $Tm_3Al_5O_{12}$ | $Y_{1.26}Tm_{1.74}Al_5O_{12}$ | 0.15 |
| $Er_3Al_5O_{12}$ | $Y_{2.84}Er_{0.16}Al_5O_{12}$ | 0.15 |
| $Y_3Al_5O_{12}$ | $Y_{2.52}Gd_{0.48}Al_5O_{12}$ | 0.15 |
| $Y_3Al_5O_{12}$ | $Y_3Al_{4.86}Sc_{0.14}O_{12}$ | 0.15 |
| $Y_3Al_5O_{12}$ | $Dy_3Al_5O_{12}$ | 0.33 |
| $Ho_3Al_5O_{12}$ | $Y_{2.50}Gd_{0.50}Al_5O_{12}$ | 0.15 |
| $Ho_3Al_5O_{12}$ | $Y_3Al_{4.85}Sc_{0.15}O_{12}$ | 0.15 |

TABLE III-continued

| Body | Compressive Layer | Est. Comp. Strain (%) |
|---|---|---|
| $Ho_3Al_5O_{12}$ | $Dy_3Al_5O_{12}$ | 0.32 |
| $Dy_3Al_5O_{12}$ | $Dy_{2.24}Gd_{0.76}Al_5O_{12}$ | 0.15 |
| $Dy_3Al_5O_{12}$ | $Y_3Al_{4.52}Sc_{0.48}O_{12}$ | 0.15 |
| $Tb_3Al_5O_{12}$ | $Tb_{1.61}Gd_{1.39}Al_5O_{12}$ | 0.15 |
| $Tb_3Al_5O_{12}$ | $Y_3Al_{4.27}Sc_{0.73}O_{12}$ | 0.15 |
| $Gd_3Al_5O_{12}$ | $Gd_{1.20}Eu_{1.80}Al_5O_{12}$ | 0.15 |
| $Gd_3Al_5O_{12}$ | $Y_3Al_{3.96}Sc_{1.04}O_{12}$ | 0.15 |
| $Y_3Al_3Sc_2O_{12}$ | $Y_{2.60}Gd_{0.40}Al_3Sc_2O_{12}$ | 0.15 |
| $Dy_3Al_3Sc_2O_{12}$ | $Y_{1.48}Gd_{1.52}Al_3Sc_2O_{12}$ | 0.15 |
| $Tb_3Al_3Sc_2O_{12}$ | $Y_{0.65}Gd_{2.35}Al_3Sc_2O_{12}$ | 0.15 |
| $Gd_3Al_3Sc_2O_{12}$ | $Gd_{0.72}Eu_{2.28}Al_3Sc_2O_{12}$ | 0.15 |
| $Eu_3Al_3Sc_2O_{12}$ | $Eu_{1.20}Sm_{1.80}Al_3Sc_2O_{12}$ | 0.15 |
| $Y_3Al_5O_{12}$ | $Dy_{1.00}Ho_{2.00}Al_5O_{12}$ | 0.14 |
| $Y_3Al_5O_{12}$ | $Dy_{1.75}Ho_{1.25}Al_5O_{12}$ | 0.21 |

The compression (strain) to which the epitaxial overlayer is subjected resulting from the mismatch of the lattice constants should generally be in the order of at least 0.02% and up to about 0.40%, desirably up to about 0.20%, preferably up to about 0.15%, and more preferably yet up to about 0.10%.

Once the single crystal aluminum garnet blade body has been fabricated and polished, and once a suitable composition for the epitaxial garnet layer has been determined, all as described above, the epitaxial layer is applied. Suitable methods for epitaxial deposition of this layer include liquid phase epitaxy and chemical vapor deposition. Other suitable methods may involve powder coating the polished blade body, followed by laser surface melting and regrowth.

The growth of epitaxial garnet layers by liquid phase epitaxy is a well known procedure. It has, for example, been described by Blank et al. in *The Growth of Magnetic Garnets by Liquid Phase Epitaxy*, J. Cryst. Growth 17, 302–311 (1972). Desirably, the epitaxial growth is performed in a cleanroom or a cleanhood, such as a class 100 cleanhood, using super-cooled lead oxide-fluxed epitaxial layer melts, employing an isothermal dipping technique with suitable rotation and/or vibration of the blade bodies. An exemplary epitaxial growth procedure is detailed in Example 2, below:

EXAMPLE 2

An epitaxial layer of Gd-alloyed YAG was grown on a one-inch diameter YAG substrate wafer of (111)-orientation by standard liquid phase epitaxy techniques at a growth temperature of 996.5° C. from the melt described in Table IV, below. The growth rate was about 2.4 μm/min, and a 12 μm layer of Gd-YAG was formed over the entire wafer within 5 minutes growth time.

TABLE IV

| Oxide | Mole Fraction | Moles | Grams per Mole | Grams |
|---|---|---|---|---|
| PbO | 0.90024 | 4.29741 | 223.189 | 959.135 |
| $Al_2O_3$ | 0.01959 | 0.09351 | 101.960 | 9.535 |
| $B_2O_3$ | 0.07502 | 0.35812 | 69.620 | 24.932 |
| $Y_2O_3$ | 0.00387 | 0.01846 | 225.810 | 4.168 |
| $Gd_2O_3$ | 0.00129 | 0.00615 | 362.498 | 2.230 |
| | 1.00000 | 4.77365 | | 1000.000 |

This melt can also be described by the following composition parameters:

$Al_2O_3/(Gd_2O_3+Y_2O_3)=3.8$ $PbO/2B_2O_3=6$ $(Al_2O_3+Gd_2O_3+Y_2O_3)/(Al_2O_3+Gd_2O_3+Y_2O_3+B_2O_3+½PbO)=0.045$ $Gd_2O_3/(Gd_2O_3+Y_2O_3)=0.25$ $Y_2O_3/(Gd_2O_3+Y_2O_3)=0.75$

The epitaxially coated wafer thus obtained was broken in half, and one half was annealed in air at high temperature over a period of 150 minutes, during which time the temperature was raised from about 1050° C. to about 1460° C. (it was held at a temperature above about 1400° C. for about 1 hour), followed by cooling to room temperature over a period of about 45 minutes. The as-grown and annealed halves were subjected to X-ray diffraction; the measured data are shown in Table V, below:

TABLE V

|  | As-Grown | Annealed |
|---|---|---|
| $a_f$(Å, measured) | 12.0303 | 12.0312 |
| $a_s$(Å, measured) | 12.0067 | 12.0073 |
| $\Delta_a$(Å, measured) | 0.0236 | 0.0239 |
| $\Delta_a$(Å, corr.) | 0.0142 | 0.0144 |
| Strain (%) | 0.118 | 0.12 |
| Stress (MPa) | 450 | 458 |

In Table V, above, $a_f$ is the lattice constant of the epitaxial layer measured normal to the face; $a_s$ is the lattice constant of the YAG substrate measured normal to the face and viewed through the epitaxial layer; $\Delta a$(measured) is the difference in these lattice constants; $\Delta a$(corr.) is the difference in lattice constant as corrected for strain by Poisson's ratio; Strain (%) is the compressive strain of the layer; and Stress (MPa) is the compressive stress calculated from this strain. The following equation is used to calulate the mismatch of lattice constant betweeen the epitaxial layer and the substrate crystal wafer from the mismatch measured in the direction normal to the plane:

$$(\Delta a/a)=[(1-v)/(1+v)](\Delta d/d)$$

where ($\Delta a/a$) is the corrected lattice constant mismatch, ($\Delta d/d$) is the lattice constant mismatch measured along the direction normal to the plane of the substrate, and $v$ is the Poisson ratio. For aluminum garnets, $[(1-v)/(1+v)]\approx 0.6$. As the above date show, within limits of measurement the compressive strain is unchanged by the anneal. This demonstrates full retention of the compressive strain after exposure to high temperature.

As stated above, the epitaxial garnet layer can also be provided by means of chemical vapor deposition employing known procedures, for example the procedure described by Mee et al. in *Chemical Vapor Deposition of Epitaxial YIG on YAG and Epitaxial GdIG on YAG*, Appl. Phys. Lett. 10, No. 10, 289-291 (1967).

The thickness of the epitaxial layer should be in the order of from about 5 µm to about 1,000 µm, more desirably in the order of from about 10 µm to about 500 µm, and preferably from about 25 µm to about 250 µm. The thicker layers are not necessarily better. In selecting a suitable thickness, it should be kept in mind that stress will decrease with increasing thickness of the epitaxial layer, and with increasing thickness the substrate may tend to distort.

In a particularly desirable embodiment of the present invention, two or more successive epitaxial garnet layers, each as above described, are deposited successively onto the fabricated and polished aluminum garnet body, to provide graded compression. Each of these layers has successively larger lattice dimensions than the previous layer, as described in detail above for the first layer. Successive epitaxial layers may be deposited without intervening polishing treatment, if no intervening grinding operation is involved, as will ordinarily be the case. The graded compression provided by such successive layers will limit shear stresses between substrate and epitaxial layer near curved surfaces.

The methods for growing the single crystal garnet boule or ingot for the blade body; for fabricating the blade out of the single crystal boule or ingot; for polishing the fabricated blade body; and for depositing the epitaxial garnet layer or layers all employ techniques which, individually, are known to those skilled in the art.

Single crystal turbine blades of the present invention having an blade body of the composition $Y_3Al_5O_{12}$ (yttrium aluminum garnet, YAG) overcoated with a compressed aluminum garnet layer as above described have superior strength and impact resistance at high temperatures in oxidizing atmospheres, such as in the turbine section of a jet engine. They are suitable for continuous operation at temperatures in excess of 1400° C. in this environment. Presently, nickel and cobalt based superalloy blades are limited to metal temperatures in the order of about 900° C. or less, because of loss of necessary strength properties at temperatures above this limit. To maintain blade temperatures below about 900° C. in a gas stream with a temperature above about 1500° C., as is present in the turbine section of jet engines, requires elaborate cooling means (internal cooling passages), and use of considerable quantities of by-pass compressed air. The oxide single crystal blades of the present invention are capable of operating at higher temperatures than metal alloy blades. They can be operated without the need for cooling means, thereby greatly simplifying engine design and increasing operating efficiency.

As demonstrated by Example 2, the surface stresses imparted by the epitaxial growth technique on YAG single crystal blades survive for long times at surprisingly high temperatures, above 0.75 times the absolute melting temperature (about 1400° C. for YAG, which has a melting temperature of 1950° C.). This refractory state of stress, achievable with single crystal garnets, is a direct result of the singular lack of crystalline and structural defects including amorphous structure, free volume, mobile disclocations and grain boundaries, all of which mediate stress relaxation in glassy and polycrystalline bodies at temperatures on the order of 0.3–0.4 times the absolute melting point.

EXAMPLE 3

Ho3Al5O12 (HoAG) Epitaxial Layers on YAG: Retention of Wafer Bowing Due to Compressive Strain After High Temperature Anneal Two epitaxial layers of $Ho_3Al_5O_{12}$ (HoAG) were prepared by the liquid phase epitaxy technique on one side of one-inch diameter, 0.020-inch thick, (111)-oriented wafers of $Y_3Al_5O_{12}$ (YAG) from the melt composition listed in Table VI, below.

TABLE VI

| Oxide | Mole Fraction | Moles | Grams |
|---|---|---|---|
| $Pb_o$ | 0.90024 | 3.42798 | 765.089 |
| $Al_2P_3$ | 0.01959 | 0.07459 | 7.606 |
| $B_2O_3$ | 0.07502 | 0.28567 | 19.888 |
| $Ho_2O_3$ | 0.00516 | 0.01963 | 7.417 |
|  | 1.00000 | 3.80787 | 800.000 |

The melt composition of Table VI can be specified by the following ratios:

$Al_2O_3/Ho_2O_3=3.8$ $PbO/2B_2O_3=6.0$ $(Ho_2O_3+Al_2O_3)/(Ho_2O_3+Al_2O_3+B_2O_3+½PbO)=0.045.$

The growth conditions for these layers appear in Table VII, below. Substrate rotation rate in each case was 200 rev/min.

TABLE VII

Conditions for growth of epitaxial layers of $Ho_3Al_5O_{12}$ on $Y_3Al_5O_{12}$.

| Layer ID | $T_G$ | f | t | h | Comments |
|---|---|---|---|---|---|
| 10830-2-2 | 1003.0 | 0.37 | 120 | 44.0 | annealed |
| 11101-2-1 | 964.5 | 1.03 | 45 | 46.3 | reference |

$T_G$ = Growth Temperature (°C.);
f = Growth Rate (µm/min);
t = growth time (min),
h = thickness (µm).

The wafers were warped after epitaxy because of the lattice constant mismatch between the epitaxial layer and the YAG wafer, the same mismatch which induces the compressive stress state in the epitaxial wafer. This warpage is a measure of the stress state of the wafer. It was measured in with a profilometer (Tencor Instruments). This radially symmetric warpage, or "bow," of a wafer can be described by the relative height of the center of the wafer with respect to points at equal and opposite distances along a diameter of the wafer. We measure units of wafer bow in µm/cm; that is, the relative height of the center of the wafer with respect to two points 5 mm distant on opposite sides of a diameter through the center.

Wafer bow was measured for the reference layer (11101-2-1) before and after epitaxial growth; and for epitaxial layer 10830-2-2 in the as-grown state, after an anneal of 1300° C. for 4.5 hours, and after a 1650° C. anneal for 1, 10, and 100 total hours. Results are summarized in Table VIII, below.

TABLE VIII

| Layer ID | Comments | Temp. (°C.) | Time (hr) | Bow (µm/cm) |
|---|---|---|---|---|
| 11101-2-1 | bare Wafer Ref. | — | — | 0.00 |
| 11101-2-1 | as Grown Ref. | — | — | 3.77 |
| 10830-2-2 | as Grown | — | — | 2.99 |
| 10830-2-2 | annealed | 1300 | 4.5 | 3.01 |
| 10830-2-2 | annealed | 1650 | 1 | 2.93 |
| 10830-2-2 | annealed | 1650 | 10 | 2.98 |
| 10830-2-2 | annealed | 1650 | 100 | 2.29 |

As the data in Table VIII show, there is essentially no change in bow, within experimental precision, after an anneal of 1300° C. for 4.5 hours, and after a 1650°·C./10 hour anneal. This means that the compressive stress state of the epitaxial layer is also unchanged. After 100 hours at 1650° C., the bow was reduced to about 2.29 µm/cm, or about 75% of its initial value, indicating that substantial compressive stress was still present in the epitaxial layer.

EXAMPLE 4

$(Y,Gd)_3Al_5O_{12}$ (Gd-YAG) Epitaxial Layers on YAG: Retention of Wafer Bowing Due to Compressive Strain After High Temperature Anneal Two epitaxial layers of $(Y,Gd)_3Al_5O_{12}$ (Gd-YAG) were prepared on one side of one-inch diameter, 0.020-inch thick, (111)-oriented wafers of $Y_3Al_5O_{12}$ (YAG) from the melt composition listed in Table IX, below.

TABLE IX

| Oxide | Mole Fraction | Moles | Grams |
|---|---|---|---|
| PbO | 0.90024 | 4.29741 | 959.135 |
| $Al_2O_3$ | 0.01959 | 0.09351 | 9.535 |
| $B_2O_3$ | 0.07502 | 0.35812 | 24.932 |
| $Y_2O_3$ | 0.00387 | 0.01846 | 4.168 |
| $Gd_2O_3$ | 0.00129 | 0.00615 | 2.230 |
| | 1.00000 | 4.77364 | 1000.000 |

This composition can be specified by the following ratios:

$Al_2O_3/(Y_2O_3+Gd_2O_3)=3.8$ $PbO/2B_2O_3=6.0$ $(Y_2O_3+Gd_2O_3+Al_2O_3)/(Y_2O_3+Gd_2O_3+Al_2O_3+B_2O_3+½PbO)=0.045$ $Gd_2O_3/(Y_2O_3+Gd_2O_3)=0.25$ $Y_2O_3/(Y_2O_3+Gd_2O_3)=0.75$

The growth conditions for these layers appear in Table X, below. Substrate rotation rate was 200 rev/min.

TABLE X

| Layer ID | $T_G$ | f | t | h |
|---|---|---|---|---|
| 20109-2-3 | 990.5 | 1.35 | 30 | 40.4 |
| 20110-2-1 | 989.5 | 1.36 | 15 | 20.4 |

$T_G$ = growth temperature (°C.);
f = growth rate (µm/min);
t = growth time (min),
h = thickness (µm).

Wafer bow was measured for each wafer before and after epitaxial growth; and after epitaxial growth and a 1650° C. anneal for one hour. The measurements are shown in Table XI.

TABLE XI

| Layer ID | Comments | Temp. (°C.) | Time (hr) | Bow (µm/cm) |
|---|---|---|---|---|
| 20109-2-3 | bare Wafer | — | — | 0.43 |
| 20110-2-1 | bare Wafer | — | — | 0.27 |
| 20109-2-3 | as Grown | — | — | 9.50 |
| 20110-2-1 | as Grown | — | — | 5.49 |
| 20109-2-3 | annealed | 1650 | 1 | 8.93 |
| 20110-2-1 | annealed | 1650 | 1 | 5.48 |

The data of Table XI show that there is essentially no change in bow, within experimental precision after an anneal at 1650° C. for one hour. This means the compressive stress state of the epitaxial layer is also unchanged after this high temperature exposure.

EXAMPLE 5

Twelve YAG rods, 85 mm long and 5 mm diameter, were cut from a large single crystal boule by core drilling along the <111> crystallographic axis. The core drilling process produced a somewhat rough, matte surface on the rods, similar to the surface that would result from a grinding process for fabricating a shaped article, such as a spring body, from a solid YAG single crystal block. Two of the rods were held as controls, and the others were chemically polished as follows: six were pre-etched in a 3:1 by volume mixture of phosphoric and sulfuric acid at 160° C. for 30 minutes, then polished in phosphoric acid at 400° C. for 15 minutes; and the remaining four were pre-etched in a 3:1 mixture of phosphoric and sulfuric acid at 160° C. for 30 minutes, and then polished in phosphoric acid at 400° C. for 30 minutes. The fracture strength of these rods was then determined by the three-point bend test using a span of 40 mm and a crosshead rate of 0.02 in/min (0.51 mm/min). The results are summarized in Table XII, below:

TABLE XII

Fracture Strength of Unpolished (Rods 1 and 2) and Chemically Chemically Polished Rods (Rods 3–12)

| Rod No. | Removal Rate μm/min | Polishing Time minutes | Material Removed μm | Fracture Strength MPa |
|---|---|---|---|---|
| 1 | 0 | 0 | 0 | 79 |
| 2 | 0 | 0 | 0 | 140 |
| 3 | 3.25 | 15 | 48.8 | 290 |
| 4 | 3.67 | 15 | 55.1 | 285 |
| 5 | 3.96 | 15 | 59.4 | 387 |
| 6 | 6.29 | 15 | 94.4 | 522 |
| 7 | 6.69 | 15 | 100.3 | 476 |
| 8 | 7.16 | 15 | 107.4 | 809 |
| 9 | 4.52 | 30 | 135.6 | 1914 |
| 10 | 5.13 | 30 | 153.9 | 682 |
| 11 | 5.62 | 30 | 168.6 | 656 |
| 12 | 6.54 | 30 | 196.2 | 750 |

As the data in Table XII show, the fracture strength of the chemically polished rods significantly exceeds that of the unpolished rods. A certain critical removal of surface material must be obtained to overcome the detrimental effects of the machining process. The fracture strength of Rod No. 9, which is measured at 1914 MPa, should be considered a high material strength, since is is more than 1% of the shear modulus of YAG.

EXAMPLE 6

Surface flow tolerance tests on coated YAG wafers and an uncoated YAG wafer control were conducted as follows. The samples were indented under various loads using a Vickers diamond pyramid indentor. The indented samples were then strength tested using the ball-on-disk method of ASTM Standard F394. The test results are summarized in Table XVI, below. The test samples were as follows:

Control: uncoated YAG wafers, 0.5 mm thick (designated "Control" in Table XIII);

Sample 1: YAG wafers, 0.5 mm thick, coated with epitaxial dysprosium aluminum garnet (DAG), 5.35±0.45 μm thick DAG coating (designated "DAG on YAG" in Table XIII); and Sample 2: YAG wafers, 0.5 mm thick, first coated with epitaxial holmium aluminum garnet (HoAG), 34.6±4.0 μm thick, followed by a coating of epitaxial dysprosium aluminum garnet (DAG), 5.6±0.6 μm thick (designated "DAG on HoAG on YAG" in Table XIII).

TABLE XIII

| Indentation Load (g) | Mean Fracture Strength (MPa) [figures in () denote Std. Deviation] | | |
|---|---|---|---|
| | Control | DAG on YAG | DAG on HoAG on YAG |
| 5 | 417 (47.5) | 1,196 (22.6) | |
| 15 | 465 (245.1) | 1,074 (254.7) | |
| 50 | 263 (41.8) | 1,156 (473.3) | |

TABLE XIII-continued

| Indentation Load (g) | Mean Fracture Strength (MPa) [figures in () denote Std. Deviation] | | |
|---|---|---|---|
| | Control | DAG on YAG | DAG on HoAG on YAG |
| 100 | 176 (14.1) | | |
| 150 | | 374 (35.6) | 462 (43.4) |
| 500 | | 182 (33) | 291 (19.9) |

EXAMPLE 7

Five YAG wafers, each 0.5 mm thick, were coated with 5.35±0.45 μm thick dysprosium aluminum garnet compressive layers. The coated wafers were then indented at a load of 50 grams using a Vickers diamond pyramid indentor. The indented wafers were then strength tested in a argon filled furnace at 1500° C. using the ball-on-disk method of ASTM Standard F394. They had a mean fracture stress of 1246 MPa with a 182 MPa standard deviation. These results indicate high surface flaw tolerance at 1500° C.

EXAMPLE 8

Eight layers of (dysprosium,holmium)-aluminum garnet with 0.14% compressive strain were prepared on YAG wafers with thickness 28.8±2.9 μm from the melt composition specified in Table XIV. These layers were prepared at a temperature of 882°±13° C. at a growth rate of 0.68±0.12 μm/min.

TABLE XIV

Composition of melt for growth of epitaxial layers of (dysprosium, holmium)-aluminum garnet with 0.14% compressive strain on yttrium aluminum garnet.

| Oxide | Mole Fraction | Moles | Grams |
|---|---|---|---|
| PbO | 0.90539 | 4.3040 | 960.558 |
| $Al_2O_3$ | 0.01516 | 0.0720 | 7.350 |
| $B_2O_3$ | 0.07545 | 0.3590 | 24.970 |
| $Dy_2O_3$ | 0.00200 | 0.0095 | 3.538 |
| $Ho_2O_3$ | 0.00200 | 0.0095 | 3.584 |
| Totals | 1.00000 | 4.7540 | 1000.000 |

Four of these wafers were indented at 200 grams with a vickers diamond pyramid indentor, and the other four were indented at 500 grams. These were fracture tested at room temperature using the ball-on-disk method (ASTM Standard F394), and the test data appear in Table XV.

TABLE XV

Room temperature indentation fracture strength for epitaxial layers of (dysprosium, holmium)-aluminum garnet with 0.14% compressive strain on yttrium aluminum garnet.

| Compressive Strain (%) | Indentation Load (g) | Mean Fracture Stress (MPa) | Standard Deviation of Fracture Stress |
|---|---|---|---|
| 0.14 | 200 | 825 | 20 |
| 0.14 | 500 | 764 | 39 |

These data show that significant strength is retained after indentation damage.

EXAMPLE 9

Eight layers of (dysprosium,holmium)-aluminum garnet with 0.21% compressive strain were prepared on YAG wafers with thickness 26.6±0.8 μm from the melt composition specified in Table XVI. These layers were prepared at a temperature of 894°±11° C. at a growth rate of 0.89±0.03 μm/min.

TABLE XVI

Composition of melt for growth of epitaxial layers of (dysprosium, holmium)-aluminum garnet with 0.21% compressive strain on yttrium aluminum garnet

| Oxide | Mole Fraction | Moles | Grams |
| --- | --- | --- | --- |
| PbO | 0.90539 | 4.3040 | 960.577 |
| $Al_2O_3$ | 0.01516 | 0.0720 | 7.350 |
| $B_2O_3$ | 0.07545 | 0.3590 | 24.970 |
| $Dy_2O_3$ | 0.00280 | 0.0133 | 4.953 |
| $Ho_2O_3$ | 0.00120 | 0.0057 | 2.150 |
| Totals | 1.00000 | 4.7540 | 1000.000 |

Four of these wafers were indented at 200 grams with a vickers diamond pyramid indentor, and the other four were indented at 500 grams. These were fracture tested at room temperature using the ball-on-disk method (ASTM Standard F394), and the test data appear in Table XVII.

TABLE XVII

Room temperature indentation fracture strength for epitaxial layers of (dysprosium, holmium)-aluminum garnet with 0.21% compressive strain on yttrium aluminum garnet.

| Compressive Strain (%) | Indentation Load (g) | Mean Fracture Stress (MPa) | Standard Deviation of Fracture Stress |
| --- | --- | --- | --- |
| 0.21 | 200 | 1024 | 95 |
| 0.21 | 500 | 970 | 29 |

These data show that significant strength is retained after indentation damage.

We claim:

1. A blade for use in turbine engines comprising a single crystal aluminum garnet body, said body having deposited thereon an epitaxial aluminum garnet layer having a lattice constant larger than that of the single crystal garnet body sufficient to provide a compressive strain of from about 0.02 to about 0.40 percent, wherein the surface of said single crystal aluminum garnet body has been subjected to a polishing treatment before deposition of said epitaxial aluminum garnet layer.

2. The blade of claim 1 wherein the compressive strain is from about 0.02 to about 0.20 percent.

3. The blade of claim 1 wherein said single crystal garnet is a rare earth aluminum garnet, and said epitaxial garnet layer is an epitaxial rare earth aluminum garnet layer.

4. The blade of claim 2 wherein said single crystal garnet has the composition $RE_3Al_3Sc_2O_{12}$ wherein RE is selected from the group consisting of Y, Dy, Tb, Gd and Eu, and mixtures thereof.

5. The blade of claim 2 wherein said single crystal garnet is an yttrium aluminum garnet.

6. The blade of claim 5 wherein said epitaxial garnet layer is an yttrium aluminum garnet substituted with a rare earth element selected from the group consisting of Ho, Dy, Tb, Gd, Eu, Sm, Nd, Pr and La, and mixtures thereof.

7. The blade of claim 6 wherein said epitaxial garnet layer is an epitaxial gadolinium-alloyed yttrium aluminum garnet.

8. The blade of claim 1 wherein said single crystal garnet body is selected from garnets of the composition $Dy_3Al_3Sc_2O_{12}$, $Tb_3Al_3Sc_2O_{12}$, $Gd_3Al_3Sc_2O_{12}$ and $Eu_3Al_3Sc_2O_{12}$.

9. The blade of claim 2 wherein said singly crystal garnet body is a holmium aluminum garnet, and said epitaxial garnet layer is a dysprosium aluminum garnet layer.

10. The blade of claim 2 wherein said singly crystal garnet body is an yttrium aluminum garnet, and said epitaxial garnet layer is a dysprosium aluminum garnet layer.

11. The blade of claim 1 wherein said single crystal garnet body has been subjected to a chemical polishing treatment before deposition of said epitaxial garnet layer.

12. The blade of claim 7 wherein said single crystal garnet body has been subjected to a chemical polishing treatment before deposition of said epitaxial garnet layer.

13. The blade of claim 12 wherein said single crystal garnet body has been subjected to a hot phosphoric acid polishing treatment before deposition of said epitaxial garnet layer.

14. The blade of claim 13 wherein said single crystal garnet body has been subjected to a hot phosphoric acid polishing treatment before deposition of said epitaxial garnet layer, to a depth sufficient to provide in the garnet body an elastic strain at fracture of at least $10^{-3}$.

15. The blade of claim 7 wherein said eptitaxial garnet layer has a thickness of from about 5 μm to about 1000 μm.

16. The blade of claim 2 having at least two successive epitaxial layers, each having a lattice constant larger than the preceeding layer.

17. The blade of claim 16 wherein the single crystal garnet body is an yttrium aluminum garnet.

18. The blade of claim 17 wherein the compressive strain resulting from lattice mismatch between the single crystal garnet body and the first epitaxial garnet layer, and between each successive epitaxial garnet layer, is from about 0.02 to about 0.12.

19. The blade of claim 7 which comprises an integrally formed airfoil-disk.

20. The blade of claim 7 which comprises a demountable turbine blade comprising a base, an airfoil, and a platform connecting said base and said airfoil.

21. The method of forming an blade for use in turbine engines having a single crystal aluminum garnet body, which comprises, in combination:

(a) growing a single crystal aluminum garnet and forming it into blade shape;

(b) polishing said single crystal blade to remove surface imperfections; and (c) epitaxially depositing on said blade an aluminum garnet layer having a lattice constant larger than the lattice constant of said single crystal aluminum garnet of said blade, wherein the lattice mismatch is sufficient to provide a compressive strain of from about 0.02 to about 0.40 percent.

22. The method of claim 21 wherein said single crystal blade is an yttrium aluminum garnet, and wherein said polishing step is a chemical polishing step.

23. The method of claim 22 wherein said chemical polishing treatment comprises subjecting the formed blade body to the action of hot phosphoric acid for time sufficient to remove surface imperfections.

24. The method of claim 23 wherein said chemical polishing treatment comprises subjecting the formed blade body to the action of orthophosphoric acid at temperature within the range of from about 300° C. to about 350° C.

25. The method of claim 21 wherein said epitaxial aluminum garnet layer is deposited by liquid phase epitaxy.

26. The method of claim 21 wherein said epitaxial aluminum garnet layer is deposited by chemical vapor deposition.

27. The method of claim 21 wherein said epitaxial aluminum garnet layer is deposited by the method which comprises depositing on the surface of the blade body a layer of powdered aluminum garnet having the required composition for said epitaxial layer, melting said powdered aluminum garnet in contact with the blade body, followed by cooling the molten layer to affect epitaxial crystallization thereof to form said epitaxial layer.

* * * * *